United States Patent
Wakui et al.

(10) Patent No.: US 7,064,046 B2
(45) Date of Patent: Jun. 20, 2006

(54) MANUFACTURING METHOD OF SEMICONDUCTOR DEVICE

(75) Inventors: Motoaki Wakui, Kumagaya (JP); Isao Ochiai, Ota (JP); Ron Eyal, Haifa (IL); Gil Shetrit, Kiryat Tivon (IL)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 63 days.

(21) Appl. No.: 10/771,497

(22) Filed: Feb. 5, 2004

(65) Prior Publication Data

US 2005/0009302 A1  Jan. 13, 2005

(30) Foreign Application Priority Data

Feb. 6, 2003  (JP) ........................................ 2003-029578

(51) Int. Cl.
*H01L 21/30*  (2006.01)
*H01L 21/46*  (2006.01)

(52) U.S. Cl. ........................ 438/458; 438/113; 438/462; 438/463; 438/460

(58) Field of Classification Search ................. 438/455, 438/458, 460, 462, 464, 465, 113, 110
See application file for complete search history.

(56) References Cited

U.S. PATENT DOCUMENTS

| | | | |
|---|---|---|---|
| 5,087,121 A | * | 2/1992 | Kakuchi et al. ............... 356/73 |
| 5,231,262 A | * | 7/1993 | Matsumura et al. ... 219/121.67 |
| 5,319,183 A | * | 6/1994 | Hosoya et al. ......... 219/121.68 |
| 5,466,908 A | * | 11/1995 | Hosoya et al. ......... 219/121.68 |
| 6,033,288 A | | 3/2000 | Weisshaus et al. |
| 6,538,740 B1 | * | 3/2003 | Shiraishi et al. ............ 356/401 |
| 6,635,512 B1 | * | 10/2003 | Hikita et al. ................. 438/113 |

FOREIGN PATENT DOCUMENTS

| | | |
|---|---|---|
| JP | 2002-512436 | 4/2002 |
| WO | WO 99/40624 A1 | 8/1999 |

* cited by examiner

*Primary Examiner*—Amir Zarabian
*Assistant Examiner*—Thanh Y. Tran
(74) *Attorney, Agent, or Firm*—Morrison & Foerster LLP

(57) ABSTRACT

The invention provides an algorithm for aligning a rotating blade in a dicing process of partially dicing a wafer attached to a substrate. A width of a cut groove and distance between pads in the cut groove are detected by a recognition camera. Based on a result of this detection, alignment data $\Delta y$ which is distance between a centerline of the width of the cut groove and a real centerline are calculated. Based on a difference between the distance of the pads in the cut groove and a target value of the distance, data $\Delta z$ on alignment in a depth direction of the cut groove is calculated. The rotating blade is aligned by using the alignment data $\Delta y$ and $\Delta z$.

12 Claims, 9 Drawing Sheets

MANUFACTURING METHOD OF SEMICONDUCTOR DEVICE

BACKGROUND OF THE INVENTION

1. Field of the Invention

This invention relates to a manufacturing method of a semiconductor device and specifically to an algorithm for aligning a rotating blade.

2. Description of the Related Art

Generally, dicing is a mechanical process for separating a wafer substrate formed with integrated circuits into individual chips or dice by a rotating blade. FIG. 14 is a perspective view of a semiconductor wafer 100. The semiconductor wafer 100 has a plurality of chips 100a, 100b, 100c and 100d on its surface. For separating these chips 100a, 100b, 100c and 100d, a rotating blade is aligned on a center of each of dicing lines 102,104 perpendicularly crossing each other, and then a cutting process is performed by shifting the rotating blade along the dicing lines 102,104. This dicing is to completely cut the semiconductor wafer 100.

On the other hand, there has been developed a chip size package of BGA type which is formed by attaching a glass substrate on a semiconductor wafer so that ball terminals provided on the glass substrate is connected with pads of the semiconductor wafer. A dicing process for the chip size package of this type needs a process of partially dicing the semiconductor wafer from a glass substrate side to expose the pads of the semiconductor wafer in a cut groove and forming wirings for connecting the pads and the ball terminals.

In the above-descried dicing process for a chip size package of BGA type, the semiconductor wafer attached to the glass substrate need be diced partially. However, in this dicing process, a technology of properly aligning a rotating blade for performing precise dicing has not been developed.

SUMMARY OF THE INVENTION

The invention provides a method of manufacturing a semiconductor device. The method includes providing a wafer having a predetermined dicing line region and a pair of pads that are formed on a front surface of the wafer so that part of each of the pads is disposed in the dicing line region, attaching a first substrate to the front surface of the wafer, attaching a second substrate to a back surface of the wafer, and forming a cut groove from a surface of the second substrate by moving a blade along the dicing line region so as to expose an end portion of each of the pads in the cut groove. The method also includes irradiating the cut groove with detection light, measuring the width of the cut groove by detecting light reflected from opposing upper end portions of the cut groove, measuring the distance between the two pads by detecting light reflected from the exposed end portions of the two pads, and aligning the blade based on a result of the measuring of the width, the distance or both the width and the distance so that the center line of the cut groove is located at the center line of the predetermined dicing line region and that a depth of the cut groove is a predetermined depth.

In addition, this method may be modified so that the depth of the cut groove is estimated from the position of the centerline of the cut groove and the position of only one pad. Furthermore, this method is applicable to a wafer assembly that has only one substrate attached to the wafer surface.

DETAILED DESCRIPTION OF THE INVENTION

Figure 1:
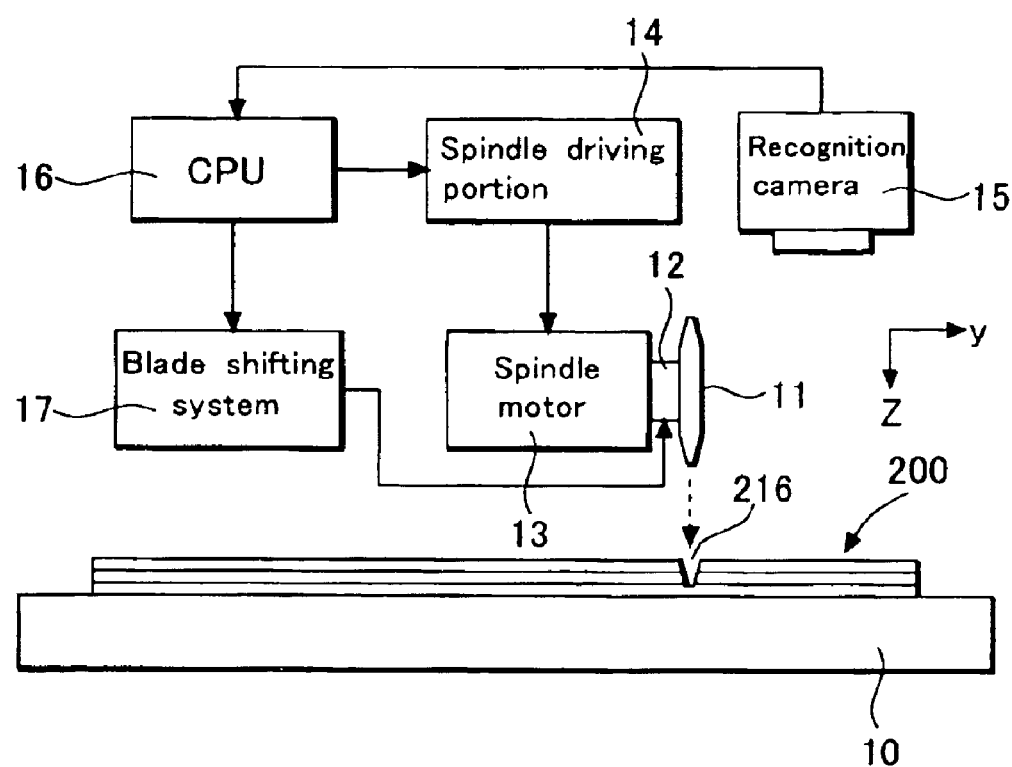
FIG. 1 is a block diagram of a dicing apparatus of a first embodiment of the invention.

Embodiments of the invention will be described with reference to the drawings in detail. A schematic structure of a dicing apparatus used in a manufacturing method of a first embodiment of this invention will be described with reference to FIG. 1. In FIG. 1, a numeral 200 designates a semiconductor wafer attached to glass substrates on its both surfaces, a numeral 10 designates a wafer stage mounted with the semiconductor wafer 200, and a numeral 11 designates a rotating blade having a disc shape which is disposed above the wafer stage 10 and connected with a spindle motor 13 through a shaft 12. A numeral 14 designates a spindle drive portion for controlling a rotation rate of the spindle motor 13.

A recognition camera 15 is located above the wafer stage 10. The recognition camera 15 detects a width of a cut groove 216 formed in the semiconductor wafer 200 by the rotating blade 11 or positions of pads exposed in the cut groove 216.

A CPU 16 calculates alignment data of the rotating blade 11 based on a result of the detection, and sends the data to a blade shifting system 17. Accordingly, y alignment and z alignment are performed to the rotating blade 11 as described later. Here, the y alignment is alignment of the rotating blade 11 in a perpendicular direction (y direction) to a line direction of a dicing region, and the z alignment is alignment of the rotating blade 11 in a depth direction (z direction) of the cut groove 216.

Figure 2:
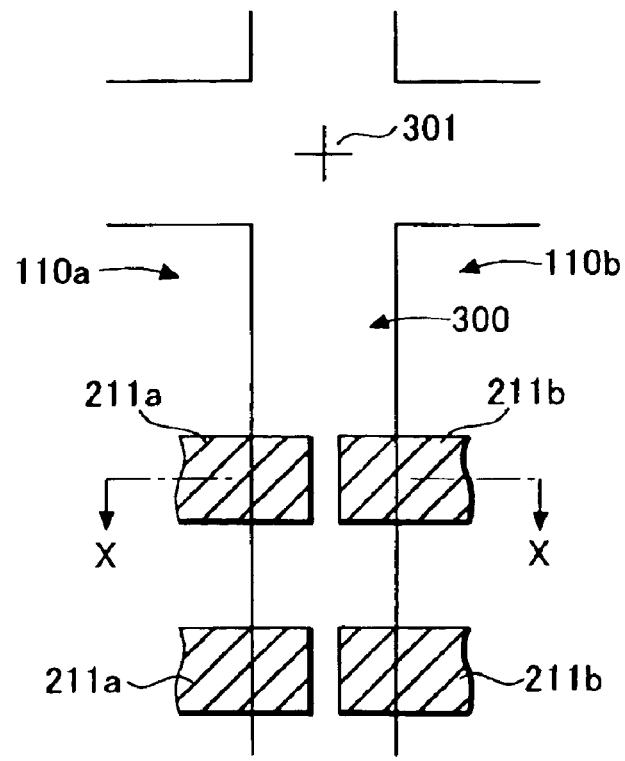
FIG. 2 is a plan view of a periphery of a dicing line region of the first embodiment of the invention.
Figure 3:
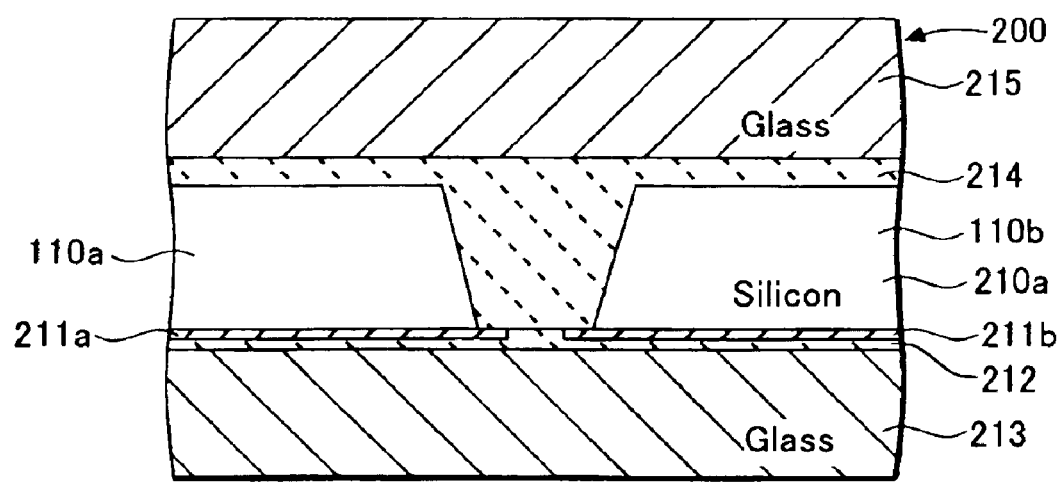
FIG. 3 is a cross-sectional view along line X—X of FIG. 2.

Next, a structure of the semiconductor wafer 200 which is to be performed with dicing will be described with reference to FIGS. 2 and 3. FIG. 2 is a plan view showing a periphery of a dicing line region 300, and FIG. 3 is a cross-sectional view along line X—X of FIG. 2.

Chips 110a and 110b are located adjacent each other, interposing the dicing line region 300 therebetween. A pad 211a of the chip 110a and a pad 211b of the chip 110b extend to the dicing line region 300, facing each other at a predetermined distance. A numeral 301 designates a cross mark for alignment provided on an intersection of the dicing line regions 300.

The pads 211a and 211b are electrodes electrically connected with integrated circuits of the chips 110a and 110b, being formed on a front surface of a silicon wafer 210a through an insulating film (not shown). A first glass substrate 213 is attached on the front surface of the silicon wafer 210a, which is formed with the pads 211a and 211b, through a resin layer 212.

The silicon wafer 210a is ground at its back surface in advance to have a thickness of 100 micrometers. Furthermore, the silicon wafer 210a is etched along the dicing line regions 300 and divided into the chips 110a and 110b. The chips 110a and 110b are integrally supported by the first glass substrate 213 to form a sheet of the silicon wafer 210a as a whole. A second glass substrate 215 is attached on the back surface of the silicon wafer 210a through a resin layer 214.

Figure 4:
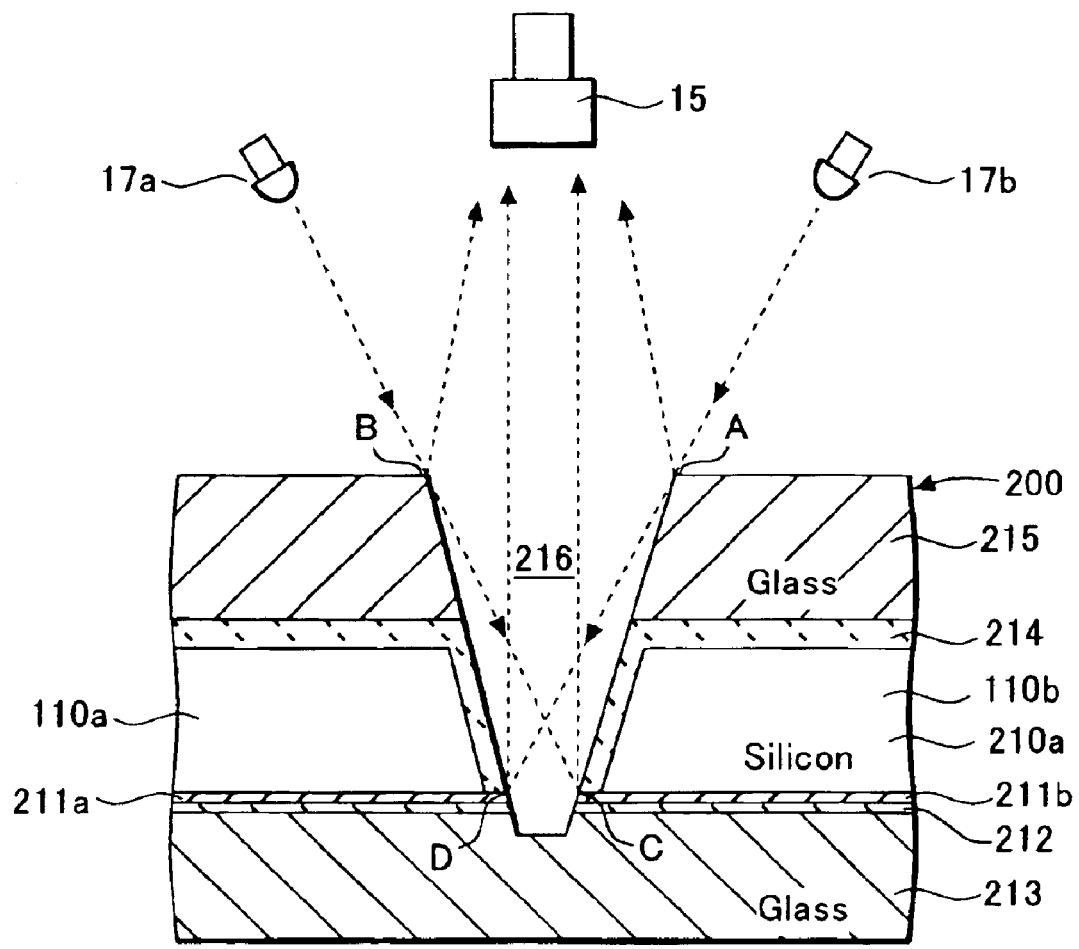
FIG. 4 is a cross-sectional view showing optical measurements of the first embodiment of the invention.

Next, a dicing process will be described with reference to FIGS. 3 and 4. First, the semiconductor wafer 200 is aligned, for example, based on the cross marks 301, and a position of a real centerline of the dicing line region 300 is detected. The V-shaped cut groove 216 is formed in a vertical direction from a surface of the second glass substrate 215 to an inside of the first glass substrate 213 through the resin layer 214 by shifting the rotating blade 11 along the line direction of the dicing line region 300.

When there occurs an offset $\Delta y$, which is a difference in a position between a centerline of the cut groove 216 and the real centerline of the dicing line region 300, the rotating blade 11 need be aligned by the offset $\Delta y$ in a horizontal direction y so as to align the centerline of the cut groove 216 on the real centerline of the dicing line region 300. This alignment is called the y alignment.

Furthermore, end portions of the pads 211a and 211b are exposed at sidewalls of the cut groove 216, and the rotating blade 11 need be aligned in a vertical direction z so that distance L2 between the pads 211a and 211b is a target value. This alignment is called the z alignment. That is, when the distance L2 is larger than a target value, the cut groove 216 should be formed shallower by making a position of an end point of the rotating blade 11 higher accordingly. When the distance L2 is smaller than the target value, the cut groove 216 should be formed deeper by making the position of the end point of the rotating blade 11 lower accordingly.

For the alignment, detection light is obliquely radiated in the cut groove 216 from light sources 17a and 17b each provided above left and right sides of the cut groove 216. Then, the recognition camera 15 positioned above the cut groove 216 catches reflected light from upper end portions A and B of the cut groove 216. Simultaneously, the recognition camera 15 also catches reflected light from end portions C and D of the pads 211a and 211b exposed at the sidewalls of the cut groove 216. That is, positions of the upper end portions A and B of the cut groove 216 and positions of the end portions C and D of the pads 211a and 211b exposed at the sidewalls of the cut groove 216 are recognized.

Figure 5:
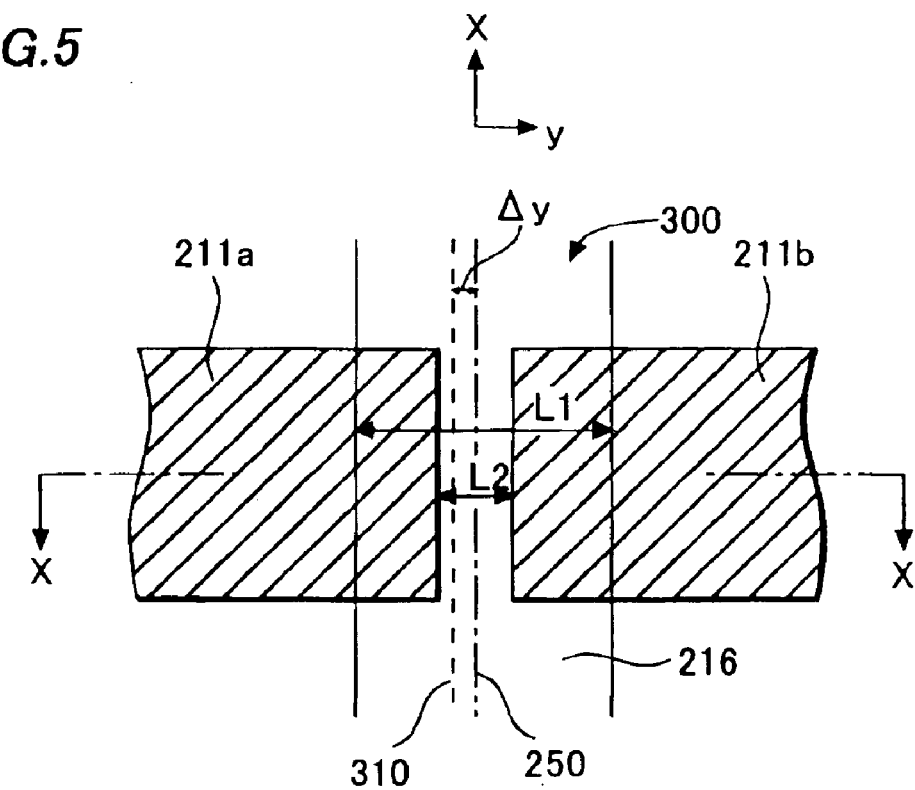
FIG. 5 is a plan view showing the measured distances of the first embodiment of the invention.
Figure 6:
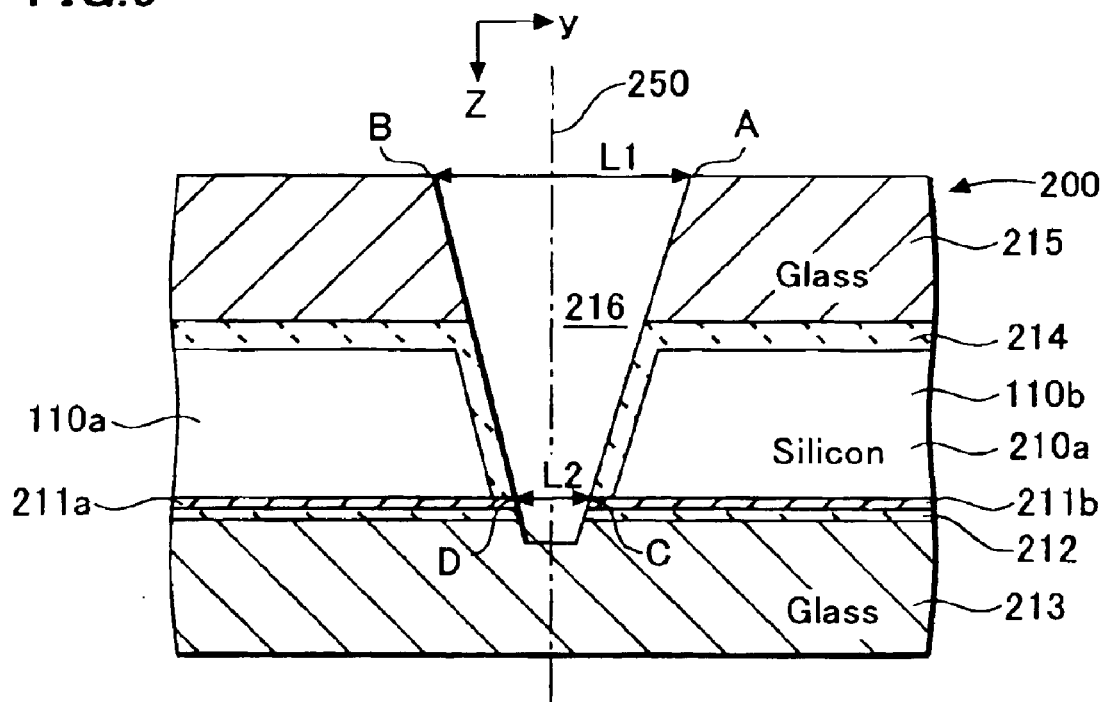
FIG. 6 is a cross-sectional view along line X—X of FIG. 5.

Accordingly, as shown in FIGS. 5 and 6, a width L1 (distance between A and B) of the cut groove 216 and the distance L2 between the pads 211a and 211b in the cut groove 216 can be detected. Based on a result of this detection, the CPU 16 calculates alignment data $\Delta y$ which is a distance (offset) between a centerline 250 of the width L1 of the cut groove 216 and a real centerline 310 previously recognized. Furthermore, the CPU 16 calculates alignment data $\Delta z$ in a vertical direction z, that is, in a depth direction of the cut groove 216 based on a difference between the detected distance L2 of the pads 211a and 211b in the cut groove 216 and a target value of the distance L2.

The CPU 16 sends the alignment data $\Delta y$ and $\Delta z$ to the blade shifting system 17, and the blade shifting system 17 aligns the rotating blade 11 according to the alignment data $\Delta y$ and $\Delta z$.

Then, dicing is performed to a next adjacent dicing region (not shown) so that the y alignment and z alignment are completed. In this case, second and subsequent dicing can be performed by the rotating blade 11 aligned by using the alignment data $\Delta y$ and $\Delta z$ obtained at the first dicing, or by the rotating blade 11 aligned by using alignment data $\Delta y$ and $\Delta z$ updated at each of the dicing. Accordingly, all the dicing regions 300 of the semiconductor wafer 200 are diced, completing the dicing process.

Figure 7:
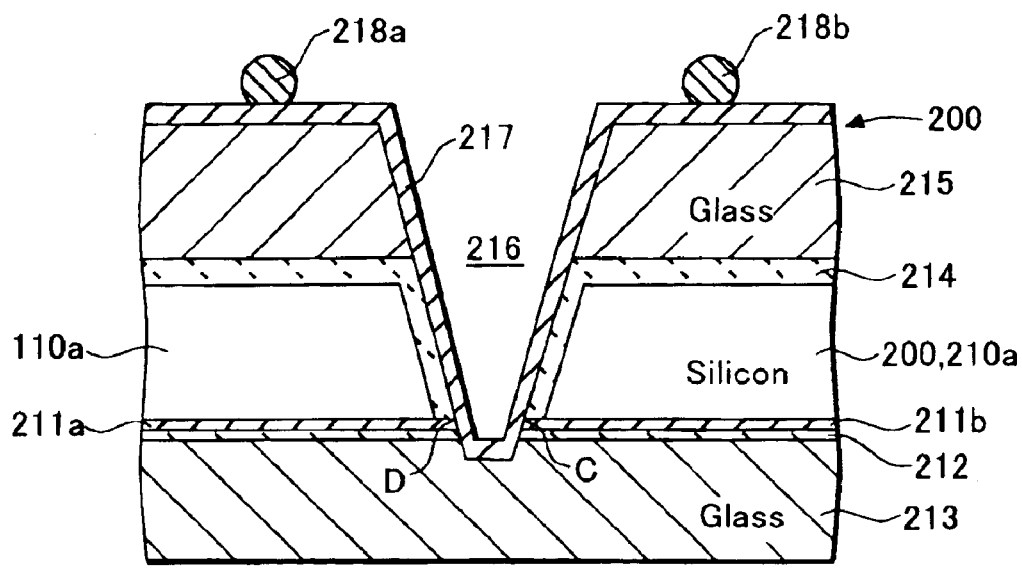
FIG. 7 is a cross-sectional view showing an electrode forming process for a BGA of the first embodiment of the invention.

The next process is the electrode forming process for the BGA. Brief description of this process will be given. As shown in FIG. 7, a wiring 217 is formed, electrically connecting with the pads 211a and 211b of the cut groove 216 and extending from the sidewalls of the cut groove 216 to the surface of the second glass substrate 215. The wiring 217 can be formed by sputtering metal such as Al (aluminum) or plating metal such as Cu (copper). Then, ball terminals 218a and 218b are formed on the wiring 217 on the surface of the second glass substrate 215. The ball terminals 218a and 218b can be formed by a screen printing method or a plating method, for example.

Figure 8:
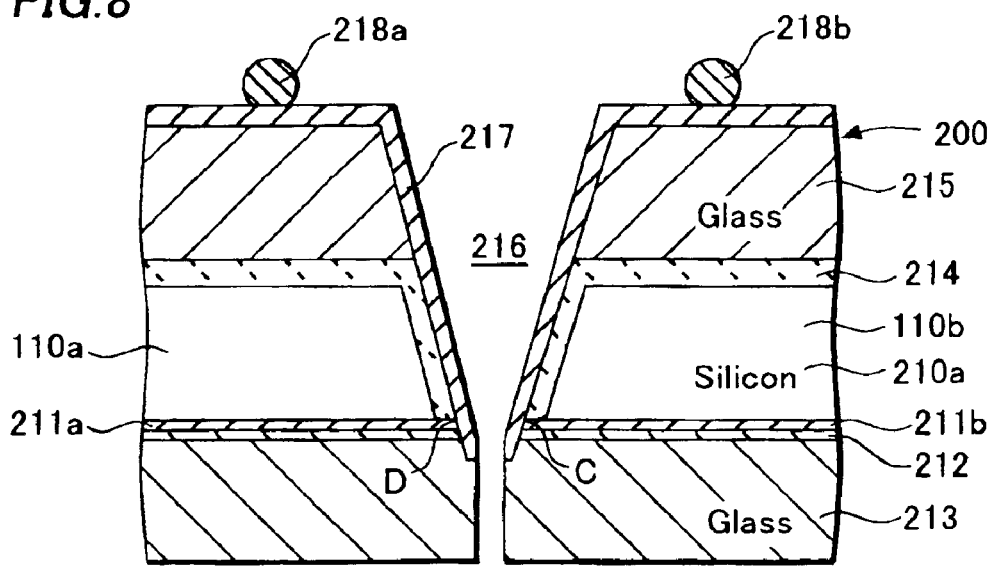
FIG. 8 is a cross-sectional view showing the electrode forming process for the BGA of the first embodiment of the invention.

Next, as shown in FIG. 8, the first glass substrate 213 at a bottom of the cut groove 216 is cut by dicing or laser beams along the dicing line region and separated into individual chips. Thus, the chip size packages of BGA type are obtained.

Although the z alignment of the rotating blade 11 is performed by using the pair of the facing pads 211a and 211b located along the dicing line region 300 in the first embodiment, a dicing method of a second embodiment of this invention performs the y alignment and the z alignment of the rotating blade 11 using only one pad formed on only one side. Note that the same dicing apparatus as that of the first embodiment can be used in the second embodiment.

Figure 9:
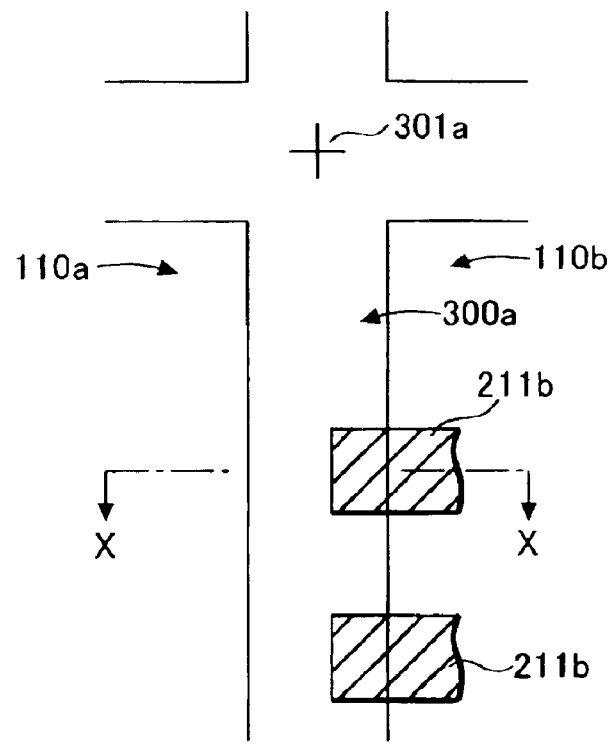
FIG. 9 is a plan view showing a periphery of a dicing line region of a second embodiment of the invention.
Figure 10:
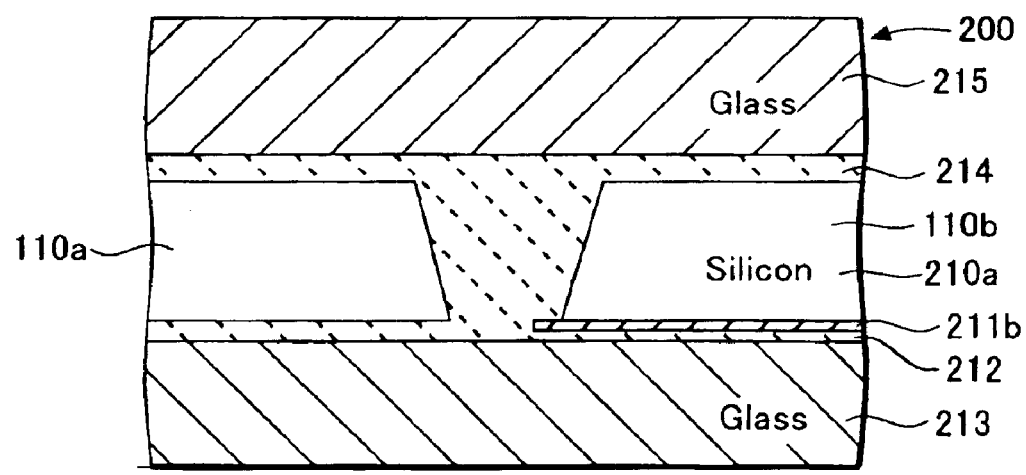
FIG. 10 is a cross-sectional view along line X—X of FIG. 9.

A structure of a semiconductor wafer of this embodiment will be described with reference to FIGS. 9 and 10. FIG. 9 is a plan view showing a periphery of a dicing line region 300a, and FIG. 10 is a cross-sectional view along line X—X of FIG. 9.

As shown in FIG. 9, in the same manner as the chip 110b of the first embodiment, a pad 211b on the chip 110b extends to the dicing line region 300a, while no pad is formed on the chip 110a which is formed adjacent the chip 110b across the dicing line region 300a. This is because the pads are not disposed on all of four sides of each of the chips 110a, 110b, 110c and 110d on the semiconductor wafer 200 under circuit design or circuit specifications. For example, one of the four sides thereof may have no pad. In such a case, as shown in FIGS. 9 and 10, one dicing line region 300a has a pad 211b on the side of the chip 110b only.

Figure 11:
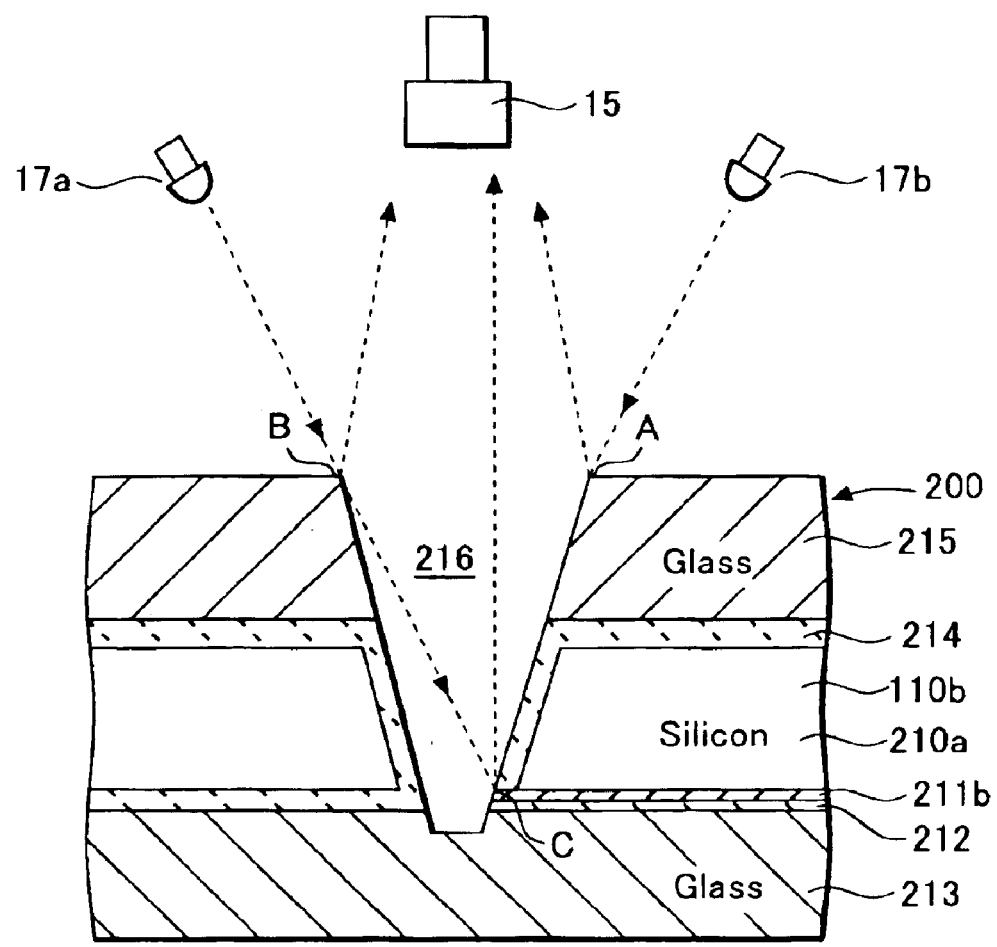
FIG. 11 is a cross-sectional view showing optical measurements of the second embodiment of the invention.

Next, a dicing process using such a pad will be described with reference to FIG. 11. First, the semiconductor wafer 200 is aligned, for example, based on a cross mark 301a, and a real centerline of the dicing line region 300a is detected.

The V-shaped cut groove 216 is formed in a vertical direction from the surface of the second glass substrate 215 to the inside of the first glass substrate 213 through the resin layer 214 by shifting the rotating blade 11 along the line direction of the dicing line region 300a. This process is the same as that of the first embodiment.

Detection light is obliquely radiated in the cut groove 216 from the light sources 17a and 17b each provided above the left and right sides of the cut groove 216. Then, the recognition camera 15 positioned above the cut groove 216 catches reflected light from the upper end portions A and B of the cut groove 216. Simultaneously, the recognition camera 15 also catches reflected light from the end portion C of the pad 211b exposed at the sidewall of the cut groove 216.

Figure 12:
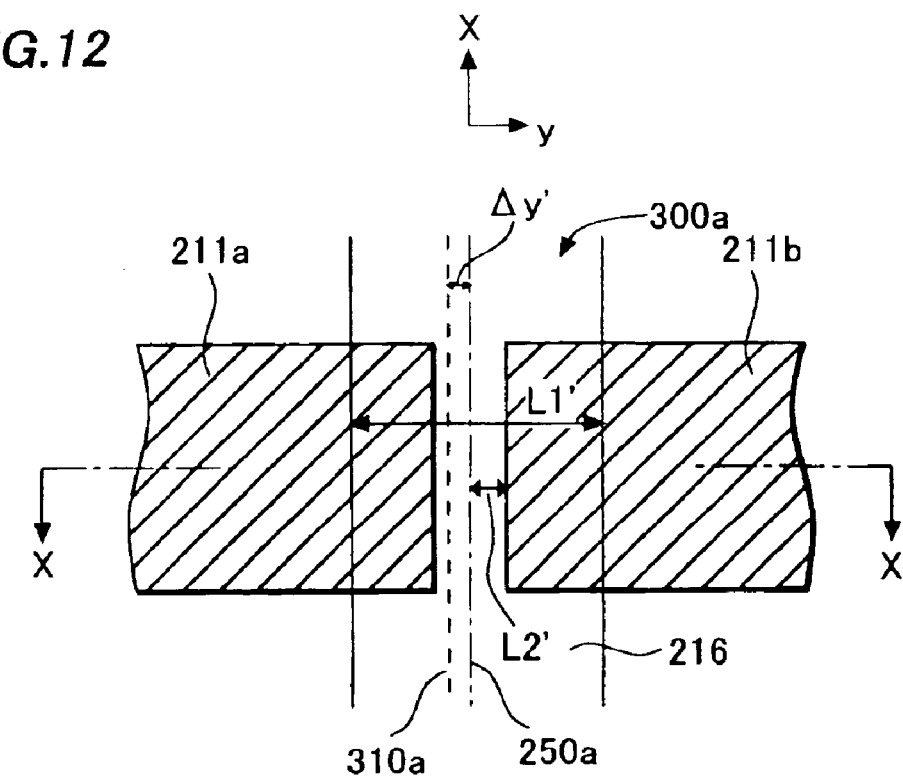
FIG. 12 is a plan view showing the measured distances of the second embodiment of the invention.
Figure 13:
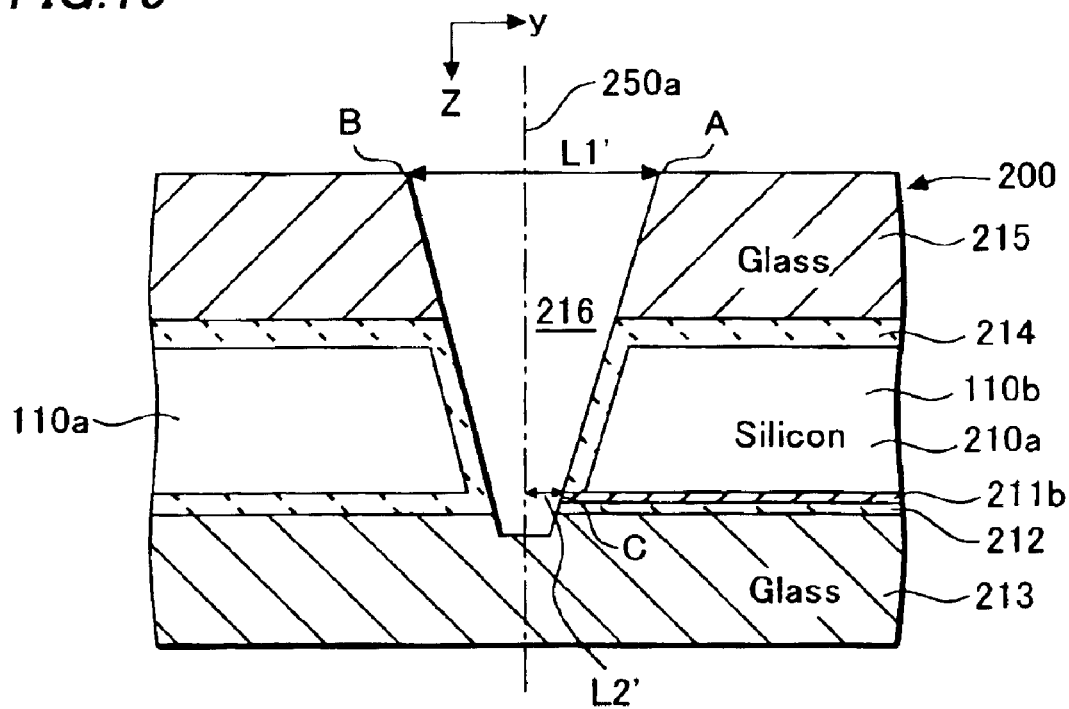
FIG. 13 is a cross-sectional view along line X—X of FIG. 12.
Figure 14:
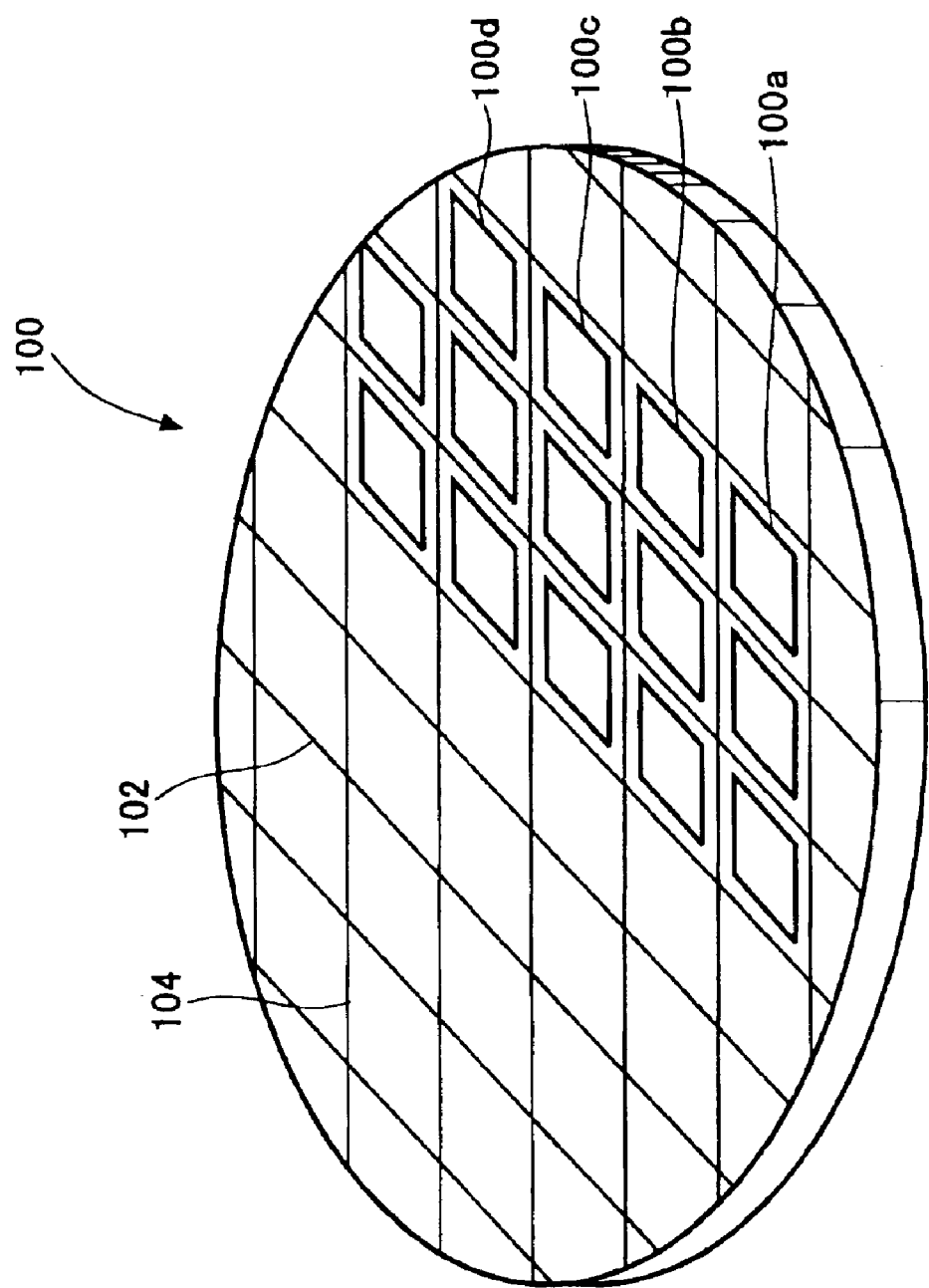
FIG. 14 is a perspective view showing a conventional dicing of a wafer.

Accordingly, as shown in FIGS. 12 and 13, a width L1' (distance between A and B) of the cut groove 216 can be detected by the recognition camera. However, the distance L2 between the pads 211a and 211b in the cut groove 216, which can be detected in the first embodiment, can not be detected since there is formed the pad 211b only.

Therefore, in this embodiment, a centerline 250a of the width L1' of the cut groove 216 is determined from a result of the detection, and then the distance L2' between the centerline 250a and the end portion C of the pad 211b is detected. Then, the distance L2' is doubled so that distance 2L2' between the pad 211b and a virtual pad 211a can be obtained. This arithmetic processing is performed by the CPU 16.

Then, the CPU 16 calculates alignment data Δy' which is distance (offset) between the centerline 250a of the width L1' of the cut groove 216 and the previously recognized real centerline 310a. Furthermore, the CPU 16 calculates alignment data Δz' in a vertical direction z, i.e., in a depth direction (z direction) of the cut groove 216 based on the difference between the distance 2L2' between the pad 211b and the virtual pad 211a of the cut groove 216 and a target value of the distance 212'.

Furthermore, the CPU 16 sends those alignment data Δy' and Δz' to the blade shifting system 17, and the blade shifting system 17 aligns the rotating blade 11 according to the alignment data Δy' and Δz'.

Then, dicing is performed to a next adjacent dicing line region (not shown) so that the y alignment and z alignment are completed. In this case, the second and subsequent dicing can be performed by the rotating blade 11 aligned by using the alignment data Δy' and Δz' obtained at the first dicing, or by the rotating blade 11 aligned by using alignment data Δy' and Δz' updated at each of the dicing.

Accordingly, all the dicing regions 300a of the semiconductor wafer 200 are diced, completing the dicing process. The next process is the electrode forming process for the BGA, but description will be omitted since the process is the same as that of the first embodiment.

Although the front and back surfaces of the semiconductor wafer 200 are respectively attached to the first glass substrate 213 and the second glass substrate 215 in the above first and second embodiments, the invention is not limited to this but can be applied to dicing of a semiconductor wafer attached to only the first glass substrate 213.

Furthermore, materials of the first glass substrate 213 and the second glass substrate 215 can be ceramics or other materials instead of glass. Even for a semiconductor wafer which is attached to a plurality of substrates, i.e., two or more substrates on its front and back surfaces, as far as the pad is formed in the semiconductor wafer, the rotating blade 11 can be aligned by using the pad according to the same method as described above.

What is claimed is:

1. A method of manufacturing a semiconductor device, comprising:
   providing a wafer comprising a predetermined dicing line region and a pair of pads that are formed on a front surface of the wafer so that part of each of the pads is disposed in the dicing line region;
   attaching a first substrate to the front surface of the wafer;
   attaching a second substrate to a back surface of the wafer;
   forming a cut groove from a surface of the second substrate by moving a blade along the dicing line region so as to expose an end portion of each of the pads in the cut groove;
   irradiating the cut groove with detection light;
   measuring a width of the cut groove by detecting light reflected from opposing upper end portions of the cut groove;
   measuring a distance between the two pads by detecting light reflected from the exposed end portions of the two pads; and
   aligning the blade based on a result of the measuring of the width, the distance or both the width and the distance so that a center line of the cut groove is located at a center line of the predetermined dicing line region and that a depth of the cut groove is a predetermined depth.

2. The method of claim 1, wherein the blade is aligned in a horizontal direction based on a distance between the centerline of the cut groove and the centerline of the dicing line region.

3. The method of claim 1, wherein the blade is aligned in a vertical direction based on the distance between the two pads.

4. The method of claim 1, wherein the light reflected from the opposing upper end portions of the cut groove or from the exposed end portions of the two pads is detected by a recognition camera.

5. A method of manufacturing a semiconductor device, comprising:
   providing a wafer comprising a predetermined dicing line region and a pad that is formed on a front surface of the wafer so that part of the pad is disposed in the dicing line region;
   attaching a first substrate to the front surface of the wafer;
   attaching a second substrate to a back surface of the wafer;
   forming a cut groove from a surface of the second substrate by moving a blade along the dicing line region so as to expose an end portion of the pad in the cut groove;
   irradiating the cut groove with detection light;
   determining a position of a centerline of the cut groove by detecting light reflected from opposing upper end portions of the cut groove;
   determining a distance between the centerline of the cut groove and the pad by detecting light reflected from the exposed end portion of the pad and by using the determined position of the centerline of the cut groove; and
   aligning the blade based on a result of the determining of the position, the distance or both the position and the distance so that the center line of the cut groove is located at a center line of the predetermined dicing line region and that a depth of the cut groove is a predetermined depth.

6. The method of claim 5, wherein the blade is aligned in a horizontal direction based on a distance between the centerline of the cut groove and the centerline of the dicing line region.

7. The method of claim 5, wherein the blade is aligned in a vertical direction based on the distance between the centerline of the cut groove and the pad.

8. The method of claim 5, wherein the light reflected from the opposing upper end portions of the cut groove or from the exposed end portion of the pad is detected by a recognition camera.

9. A method of manufacturing a semiconductor device, comprising:

providing a wafer comprising a predetermined dicing line region and a pad that is formed on a front surface of the wafer so that part of the pad is disposed in the dicing line region;

attaching a substrate to the front surface of the wafer;

forming a cut groove from a back surface of the wafer by moving a blade along the dicing line region so as to expose an end portion of the pad in the cut groove;

irradiating the cut groove with detection light;

determining a position of a centerline of the cut groove by detecting light reflected from opposing upper end portions of the cut groove;

determining a distance between the centerline of the cut groove and the pad by detecting light reflected from the exposed end portion of the pad and by using the determined position of the centerline of the cut groove; and aligning the blade based on a result of the determining of the position, the distance or both the position and the distance so that the center line of the cut groove is located at a center line of the predetermined dicing line region and that a depth of the cut groove is a predetermined depth.

10. The method of claim 9, wherein the blade is aligned in a horizontal direction based on a distance between the centerline of the cut groove and the centerline of the dicing line region.

11. The method of claim 9, wherein the blade is aligned in a vertical direction based on the distance between the centerline of the cut groove and the pad.

12. The method of claim 9, wherein the light reflected from the opposing upper end portions of the cut groove or from the exposed end portion of the pad is detected by a recognition camera.

* * * * *